United States Patent [19]
Maeda et al.

[11] Patent Number: 5,738,929
[45] Date of Patent: *Apr. 14, 1998

[54] MAGNETORESISTANCE EFFECT ELEMENT

[75] Inventors: Atsushi Maeda, Neyagawa; Satoru Oikawa, Yao; Minoru Kume, Kadoma, all of Japan

[73] Assignee: Sanyo Electric Co., Ltd., Moriguchi, Japan

[*] Notice: The term of this patent shall not extend beyond the expiration date of Pat. No. 5,585,198.

[21] Appl. No.: 766,530

[22] Filed: Dec. 13, 1996

Related U.S. Application Data

[63] Continuation of Ser. No. 326,731, Oct. 20, 1994, Pat. No. 5,585,198.

[30] Foreign Application Priority Data

Oct. 20, 1993 [JP] Japan ................... 5-262547
Mar. 24, 1994 [JP] Japan ................... 6-054163

[51] Int. Cl.⁶ ........................................ G11B 5/66
[52] U.S. Cl. ..................... 428/141; 428/336; 428/611; 428/621; 428/668; 428/635; 428/673; 428/675; 428/676; 428/680; 428/681; 428/686; 428/687; 428/692; 428/694 T; 428/694 TS; 428/694 TR; 428/694 ST; 428/694 SG; 428/900
[58] Field of Search ........................ 428/686, 687, 428/675, 676, 611, 635, 621, 673, 680, 681, 668, 692, 141, 336, 694 T, 694 TS, 694 TR, 694 ST, 694 SG, 900

[56] References Cited

U.S. PATENT DOCUMENTS

| | | | |
|---|---|---|---|
| 2,979,668 | 4/1961 | Dunlap, Jr. ................... | 330/250 |
| 3,019,125 | 1/1962 | Eggenberger et al. ........ | 428/167 |
| 3,567,525 | 3/1971 | Graham et al. ............... | 148/302 |
| 3,975,772 | 8/1976 | Lin et al. ....................... | 360/113 |
| 4,187,553 | 2/1980 | Ahn et al. ..................... | 365/8 |

(List continued on next page.)

FOREIGN PATENT DOCUMENTS

| | | |
|---|---|---|
| 58-36406 | 8/1983 | Japan. |
| 59-11522 | 1/1984 | Japan. |
| 59-63019 | 4/1984 | Japan. |
| 59-87617 | 5/1984 | Japan. |
| 60-89809 | 5/1985 | Japan. |
| 62-97118 | 5/1987 | Japan. |
| 3-257977 | 11/1991 | Japan. |
| 4-218982 | 8/1992 | Japan. |
| 4-358310 | 12/1992 | Japan. |
| 4-360009 | 12/1992 | Japan. |
| 5-114761 | 5/1993 | Japan. |
| 6-101000 | 4/1994 | Japan. |
| 6-169117 | 6/1994 | Japan. |
| 6-318515 | 11/1994 | Japan. |

OTHER PUBLICATIONS

K. Inomata et al. Giant Magnetoresistance Effect and Magnetic Anisotropy in $Co_9Fe/Cu/Co_9Fe$ Trilayers on MgO(110) Substrates, Journal of Magnetism and Magnetic Materials 137 (1994) 257–263.

(List continued on next page.)

*Primary Examiner*—Leszek Kiliman
*Attorney, Agent, or Firm*—W. G. Fasse; W. F. Fasse

[57] ABSTRACT

A magnetoresistance effect element includes a non-magnetic substrate, a ferromagnetic dispersion layer or a ferromagnetic layer, and a non-magnetic metal film. The ferromagnetic dispersion layer is a layer of a ferromagnetic metal or alloy that is independently and dispersedly formed on the substrate. The alternative ferromagnetic layer is a layer of a ferromagnetic metal or alloy that is formed on the substrate with a textured surface. The non-magnetic metal film is made of at least one atomic element having a non-soluble relation with the ferromagnetic metal or alloy, and is formed on the non-magnetic substrate and the ferromagnetic dispersion layer or the ferromagnetic layer.

17 Claims, 17 Drawing Sheets

U.S. PATENT DOCUMENTS

| | | | |
|---|---|---|---|
| 4,516,180 | 5/1985 | Narishige et al. | 360/126 |
| 4,623,867 | 11/1986 | Lundquist et al. | 338/32 R |
| 4,935,311 | 6/1990 | Nakatani et al. | 428/611 |
| 4,949,039 | 8/1990 | Grünberg | 324/252 |
| 5,117,321 | 5/1992 | Nakanishi et al. | 360/120 |
| 5,134,533 | 7/1992 | Friedrich et al. | 360/113 |
| 5,159,513 | 10/1992 | Dieny et al. | 360/113 |
| 5,164,025 | 11/1992 | Hasegawa | 148/313 |
| 5,187,628 | 2/1993 | Kanai et al. | 360/126 |
| 5,196,821 | 3/1993 | Partin et al. | 338/32 R |
| 5,206,590 | 4/1993 | Dieny et al. | 324/252 |
| 5,243,316 | 9/1993 | Sakakima et al. | 338/32 R |
| 5,268,043 | 12/1993 | McCowen | 148/310 |
| 5,277,991 | 1/1994 | Satomi et al. | 428/611 |
| 5,296,987 | 3/1994 | Anthony et al. | 360/113 |
| 5,304,975 | 4/1994 | Saito et al. | 338/32 R |
| 5,313,186 | 5/1994 | Schuhl et al. | 338/32 R |
| 5,324,593 | 6/1994 | Lal et al. | 428/610 |
| 5,366,815 | 11/1994 | Araki et al. | 428/611 |
| 5,422,621 | 6/1995 | Gambino et al. | 338/32 R |
| 5,425,819 | 6/1995 | Oohashi et al. | 148/300 |
| 5,432,734 | 7/1995 | Kawano et al. | 365/158 |
| 5,442,508 | 8/1995 | Smith | 360/113 |
| 5,462,809 | 10/1995 | Berkowitz | 428/546 |
| 5,474,833 | 12/1995 | Etienne et al. | 428/209 |
| 5,510,172 | 4/1996 | Araki et al. | 428/213 |
| 5,527,626 | 6/1996 | Gijs et al. | 428/611 |
| 5,530,608 | 6/1996 | Aboaf et al. | 360/113 |

OTHER PUBLICATIONS

P. Grünberg et al., Interlayer Exchange, Magnetotransport and Magnetic Domains in FE/CR Layered Structures, Journal of Magnetism and Magnetic Materials, 104–107, 1992, pp. 1734–1738.

Hideo Fujiwara et al. Analytical Model of Giant MR in Multilayers With Biquadratic Coupling, Journal of Magnetism and Magnetic Materials 135, 1994, pp. I 23—L29.

Martin Parker et al., Biquadratic Effects in Magnetic Multilayers With Low–Field Giant MR, Journal of the Magnetics Society of Japan, vol. 18, Supp. No. S1, 1994, pp. 371–377.

S. Demokritov et al., Evidence For Oscillations in the Interlayer Coupling of FE Films Across CR Films From Spin Waves and M(H) Curves, Europhysics Letters, 15, Aug. 1991, pp. 881–886.

Liou et al., "The process–controlled magnetic properties of nanostructured Cu/Ag composite films", J. Applied Phys. 70(10), 15 Nov. 1991, pp. 5882–5884.

Maeda et al., "Magnetoresistance Characteristics of Grain—Type Alloy Thin Films of Various Compositions,", Journal of Applied Physics. –Cond. Matter 5. Sep. 6, 1993, vol. 5 No. 36, pp. 6745–6752.

Shinjo et al. "Metallic Superlattices—Artificially Structured Materials"; Studies in Physical and Theoretical Chemistry 49; 1987; pp. 1–5.

A Berkowitz et al Physical Review Letters, Jun. 22, 1992, vol. 68, No. 25, pp. 3745–3748, "Giant Magnetoresistance In . . . ".

J.F. Smyth et al., "Hysteresis in Lithographic Arrays . . . ", Japan Appl. Phys. Apr. 15, 1991, vol. 69, No. 8, pp. 5262–5266.

A. Chaiken et al. "Low–field spin–valve magnetoresistance in Fe–Cu–Co Sandwiches", Appl. Phys. Lett. 59 Jul. 1991, pp. 240–242.

B. Dieny et al. "Giant Magnetoresistance of Magnetically Soft Sandwiches: Dependence on Temperature and on Layer Thicknesses", Physical Review B, Jan. 1992, pp. 806–813.

B. Dieny et al., "Giant magnetoresistance in Soft Ferromagnetic Multilayers", Phyriscal Review Condensed Matter, Part B, vol. 43, No. 1, pp. 1297 to 1300; 1991 The American Physical Soc.

D. H. Mosca et al. "Oscillatory Interlayer Coupling and Giant Magnetoresistance in Co/Cu Multilayers" Journal of Magnetism and Magnetic Materials 94 (1991), pp. L.1—L.5.

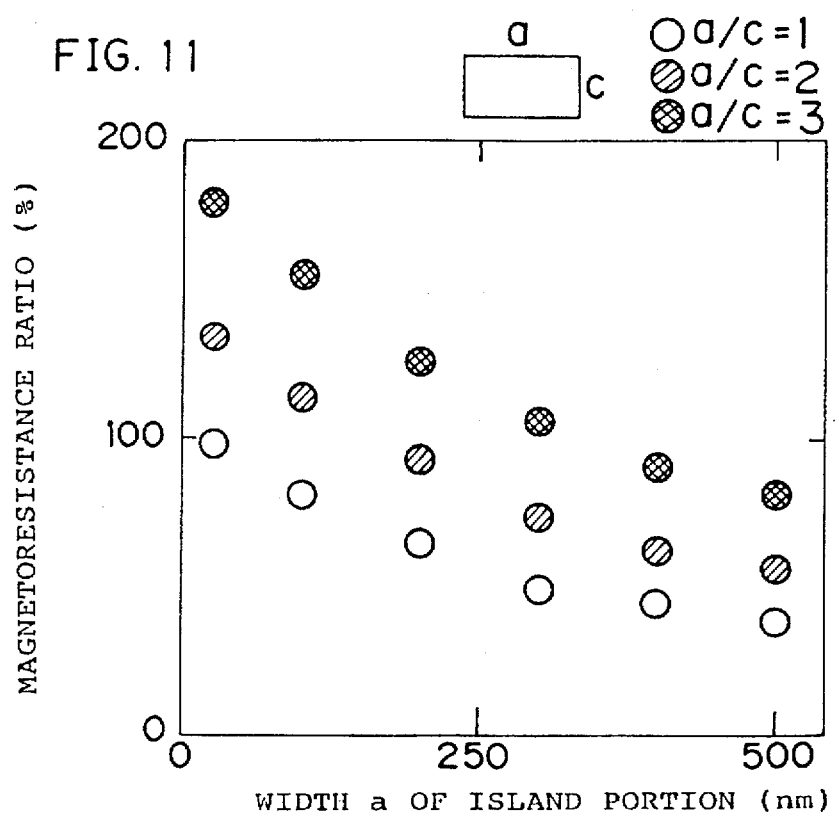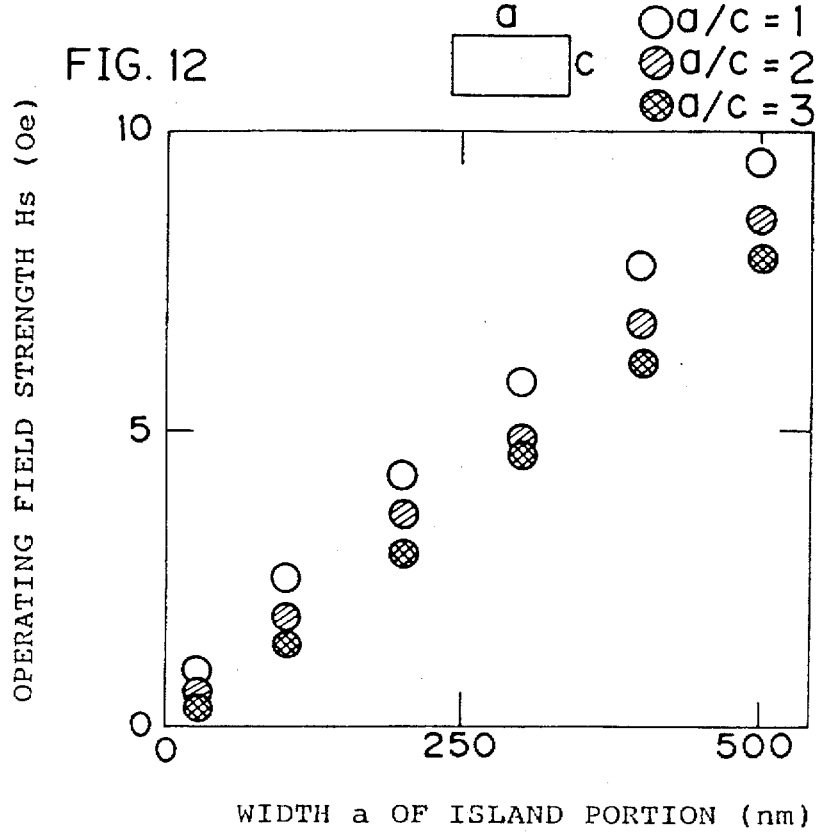

MAGNETORESISTANCE EFFECT ELEMENT

CROSS-REFERENCE TO RELATED APPLICATIONS

This application is a continuation of our application U.S. Ser. No. 08/326,731, filed on Oct. 20, 1994, and issued as U.S. Pat. No. 5,585,198 on Dec. 17, 1996.

BACKGROUND OF THE INVENTION

1. Field of the Invention

The present invention relates to a magnetoresistance effect element which can be used for a magnetic reproducing head or a magnetic sensor.

2. Description of the Background Art

A magnetoresistance effect element is adapted to detect a change in the electrical resistance of a magnetic film caused by the application of a magnetic field, thereby measuring the field strength and its change. In general, therefore, the magnetoresistance effect element must have a high magnetoresistance ratio and a small operating field strength at room temperature. A magnetic material for such a magnetoresistance effect element is generally prepared from an Fe-Ni alloy (Permalloy). Due to an extremely small magnetoresistance ratio of 2 to 3%, however, the Fe-Ni alloy is not preferable as the magnetic material for the magnetoresistance effect element, although the same has a small operating field strength of about 10 Oe.

A novel magnetoresistance effect film is disclosed in "Physical Review Letters" Vol. 68, No. 25, Jun. 22, 1992, pp. 3745-3748. This magnetoresistance effect film is formed by a CoCu alloy film consisting of Co and Cu which is in a eutectic relation of being atomically mixed with Co in a liquid phase but not in a solid phase. This alloy film exhibits a high magnetoresistance ratio exceeding 10% at an ultralow temperature of 10K. At room temperature, however, this alloy film has a small magnetoresistance ratio of 6 to 7% while its operating field strength is extremely increased to about 6000 Oe.

The inventors have proposed a magnetoresistance effect material consisting of atoms of a ferromagnetic metal and atoms of a non-magnet metal, which is in a non-soluble relation of not being atomically mixed with the ferromagnetic metal in solid and liquid phases, as a magnetoresistance effect material having a higher magnetoresistance ratio (U.S. Ser. No. 08/216,185 now U.S. Pat. No. 5,656,381).

SUMMARY OF THE INVENTION

An object of the present invention is to provide a novel structure of a magnetoresistance effect element which can improve the magnetoresistance ratio and reduce the operating field strength by reducing a saturation magnetic field.

A magnetoresistance effect element according to a first aspect of the present invention comprises a non-magnetic substrate, a ferromagnetic dispersion layer, consisting of island portions made of a ferromagnetic metal or alloy, which are independently and dispersedly formed at first areas (i.e. island bearing areas) on the non-magnetic substrate but not at a second area or areas (i.e. an island-free area) on the substrate, and a non-magnetic metal film, that is made of at least one metal element having a non-soluble relation with the ferromagnetic metal or alloy of the ferromagnetic dispersion layer, whereby the film is formed on the non-magnetic substrate at areas not having island portions thereon and on the ferromagnetic dispersion layer.

The ferromagnetic dispersion layer in the first aspect of the present invention can be formed by electron beam lithography in a semiconductor fabrication step. In a method employing this electron beam lithography, a resist film is formed on a nonmagnetic substrate and then patterned, whereafter a ferromagnetic film of a ferromagnetic metal or alloy is formed on the patterned resist film and on the exposed areas of the non-magnetic substrate. Then, the resist film is removed to leave island portions of the ferromagnetic film on the previously exposed areas of the non-magnetic substrate, thereby defining the ferromagnetic dispersion layer.

According to the first aspect of the present invention, the island portions of the ferromagnetic dispersion layer are preferably arranged with regularity. More preferably, the island portions are linearly arranged along longitudinal and transverse directions.

The ferromagnetic dispersion layer according to the first aspect of the present invention can be prepared by discontinuously forming a ferromagnetic fine grain layer on the non-magnetic substrate, for example. Such a ferromagnetic dispersion layer can be formed by sticking fine grains of ferromagnetic metal or alloy onto the non-magnetic substrate to a thickness that is insufficient for forming a continuous film. This thickness is preferably 20 to 100 Å.

The fine grains of the ferromagnetic metal or alloy can be stuck on the non-magnetic substrate by gas flow sputtering or an ion cluster beam method, for example.

While the plane shape of the ferromagnetic dispersion layer is not particularly restricted in the first aspect of the present invention, it is possible to attain a higher magnetoresistance ratio due to anisotropy in magnetic resistance when the island portions of the dispersion layer are provided in anisotropic plane shapes.

A magnetoresistance effect element according to a second aspect of the present invention comprises a non-magnetic substrate, a ferromagnetic layer made of a ferromagnetic metal or alloy, which is formed on the non-magnetic substrate and has a textured surface, and a non-magnetic metal film, that is made of at least one atom having a nonsoluble relation with the ferromagnetic metal or alloy of the ferromagnetic layer, whereby the film is formed on the textured surface of the ferromagnetic layer.

According to the second aspect of the present invention, the ferromagnetic layer having a textured surface can be prepared by forming a layer of ferromagnetic fine grains on the non-magnetic substrate in a continuous state. Such a layer of ferromagnetic fine grains can be formed by a method similar to that for forming the ferromagnetic fine grains according to the first aspect of the present invention, such as gas flow sputtering or an ion cluster beam method, for example. It is possible to form this layer in a continuous state by increasing its thickness. According to the second aspect of the present invention, the layer of ferromagnetic fine grains preferably has a thickness of 100 to 500 Å.

Further, according to the second aspect of the present invention, it is possible to prepare the ferromagnetic layer by forming a thin film of ferromagnetic metal or alloy on the non-magnetic substrate and reverse-sputtering the thin film thereby roughening its surface.

Alternatively, it is possible to texture the surface of the ferromagnetic layer by forming this layer on a non-magnetic substrate whose surface has been roughened, so that the surface of the ferromagnetic layer takes over the texture from the surface of the non-magnetic substrate in the second aspect of the present invention. While the material for the non-magnetic substrate having a roughened surface is not restricted in particular, a non-magnetic substrate of glass or silicon can be employed. It is possible to roughen the surface of such a nonmagnetic substrate by reverse sputtering, for example.

According to the second aspect of the present invention, the ferromagnetic layer preferably has a thickness of 50 to 500 Å, more preferably 50 to 300 Å.

According to each of the first and second aspects of the present invention, the thickness of the non-magnetic metal film is preferably 20 to 500 Å, and more preferably 50 to 300 Å.

A magnetoresistance effect element according to a third aspect of the present invention comprises a non-magnetic substrate, a non-magnetic metal film which is formed on the non-magnetic substrate and has a textured surface, and a ferromagnetic layer which is made of a ferromagnetic metal or alloy and which is formed on the non-magnetic metal film. The non-magnetic metal film is made of at least one atom having a non-soluble relation with the ferromagnetic metal or alloy of the ferromagnetic layer.

According to the third aspect of the present invention, it is possible to prepare the non-magnetic metal film by forming a thin film of a non-magnetic metal or alloy on the non-magnetic substrate and reverse-sputtering the thin film thereby roughening its surface.

Alternatively, it is possible to texture the surface of the nonmagnetic metal film by forming this layer on a nonmagnetic substrate whose surface has been roughened so that the surface of the film takes over the texture from the surface of the nonmagnetic substrate in the third aspect of the present invention.

According to the third aspect of the present invention, the thickness of the ferromagnetic layer is preferably 20 to 500 Å, and more preferably 50 to 300 Å.

In each of the first, second and third aspects of the present invention, the ferromagnetic metal or alloy forming the ferromagnetic dispersion layer or the ferromagnetic layer and the nonmagnetic metal forming the non-magnetic metal layer are in a nonsoluble relation whereby they are not atomically mixed with each other in solid and liquid phases.

When the ferromagnetic metal is prepared from Fe, then the nonmagnetic metal can be prepared from a metal such as Ag, Bi, Mg, Pb or an alloy thereof. When the ferromagnetic fine grains or the ferromagnetic layer is made of an Fe-based alloy, then Co, Ni, Cu or Zn can be employed as an alloying element, for example.

When the ferromagnetic metal is prepared from Co, the non-magnetic metal can be prepared from Ag, Pb or an alloy thereof, for example. When the ferromagnetic fine grains or the ferromagnetic layer is made of Co-based alloy, then V, Cr or Mn can be employed as an alloying element, for example.

When the ferromagnetic metal is prepared from Ni, then the nonmagnetic metal can be prepared from Ag, for example. When the ferromagnetic fine grains or the ferromagnetic layer is prepared from Ni-based alloy then V, Cr or Mn can be employed as an alloy ing element, for example.

Among the above examples, the most typical ferromagnetic metal or alloy is Co metal or NiFe alloy, while the most typical nonmagnetic metal is Ag metal.

In each of the first, second and third aspects of the present invention, the non-magnetic metal film may be prepared from an alloy composed of different atoms, each of which has the nonsoluble relation as described above.

According to each of the first, second and third aspects of the present invention, a method of forming the non-magnetic metal film is not particularly restricted. The film can be formed by a general method of forming a metal or alloy film such as sputtering, vacuum deposition, MBE, CVD, ion plating or a cluster method. The ferromagnetic dispersion layer or the ferromagnetic layer according to each of the first and second aspects of the present invention can also be formed by such a method of forming a metal or alloy film.

In the first aspect of the present invention, the non-magnetic metal film is formed on the ferromagnetic dispersion layer which consists of island portions that are independently and dispersedly formed on the non-magnetic substrate at first or island-bearing areas on the substrate but not at a second or island-free area on the substrate, whereby the contact areas between the ferromagnetic dispersion layer and the non-magnetic metal film are increased as compared with those in a flat interface. The magnetization state of the ferromagnetic dispersion layer is changed from a random arrangement to a ferromagnetic arrangement with an increase of an applied magnetic field. Scattered states of conduction electrons in the non-magnetic metal film are remarkably varied with the magnetization state of the ferromagnetic dispersion layer. Due to the aforementioned large contact areas between the ferromagnetic dispersion layer and the non-magnetic metal film, the magnetoresistance ratio is extremely increased in such a laminate structure, while operating field strength is reduced.

In the second aspect of the present invention, the non-magnetic metal film is formed on the ferromagnetic layer having a textured surface. Thus, the interface between the ferromagnetic layer and the non-magnetic metal film is so textured as to increase the contact area therebetween. Thus, the non-magnetic metal film is remarkably influenced by the magnetization state of the ferromagnetic layer similarly to the first aspect, whereby the operating field strength is reduced and the magnetoresistance ratio is increased.

In the third aspect of the present invention, the ferromagnetic layer is formed on the non-magnetic metal film having a textured surface. Thus, the interface between the ferromagnetic layer and the non-magnetic metal film is so textured as to increase the contact area therebetween. Thus, the non-magnetic metal film is remarkably influenced by the magnetization state of the ferromagnetic layer similarly to the first aspect, whereby the operating field strength is reduced and the magnetoresistance ratio is increased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 illustrates relations between plane-directional widths of island portions of the ferromagnetic dispersion layer and magnetoresistance ratios in the first aspect of the present invention;

FIG. 12 illustrates relations between plane-directional widths of island portions of the ferromagnetic dispersion layer and operating field strength values in the first aspect of the present invention;

DETAILED DESCRIPTION OF THE PREFERRED EMBODIMENTS

Figure 1:
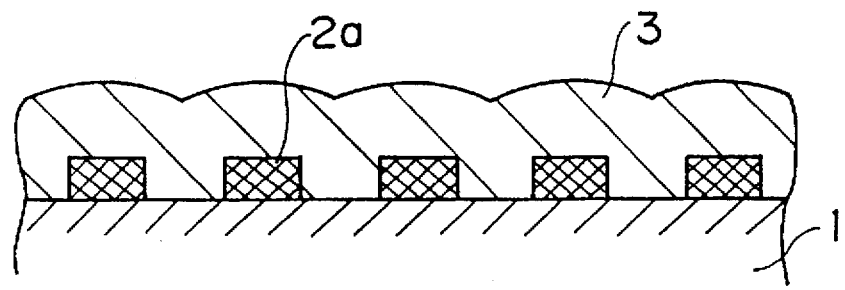
FIG. 1 is a schematic sectional view showing a magnetoresistance effect element of a first embodiment according to a first aspect of the present invention.

FIG. 1 is a schematic sectional view showing an embodiment according to a first aspect of the present invention. Ferromagnetic dispersion layer 2a having a 50 nm thickness, and consisting of Co atoms which are ferromagnetic metal atoms, is formed on a non-magnetic substrate 1 of glass only in prescribed portions, i.e. at prescribed partial areas on the substrate 1. A non-magnetic metal film 3 of 50 nm thickness, consisting of Ag atoms which are non-magnetic metal atoms, is formed on the ferromagnetic dispersion layer 2a and on the non-magnetic substrate 1 at those areas at which the layer 2a is not formed. The Co atoms forming the ferromagnetic dispersion layer 2a and the Ag atoms forming the non-magnetic metal film 3 are in a non-soluble relation whereby they are not atomically mixed with each other in solid and liquid phases.

Figure 2:
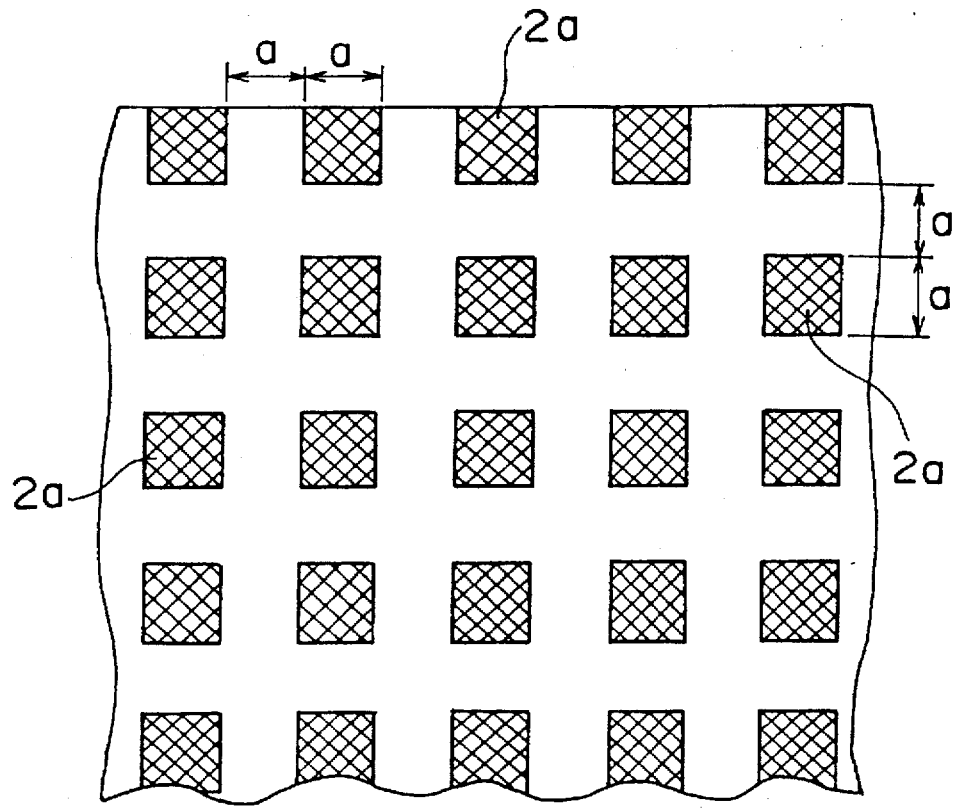
FIG. 2 is a plan view showing the arrangement of the ferromagnetic dispersion layer in the magnetoresistance effect element shown in FIG. 1.

FIG. 2 is a plan view illustrating an exemplary arrangement of the separate island portions of the ferromagnetic dispersion layer 2a shown in FIG. 1. As shown in FIG. 2, the island portions of the ferromagnetic dispersion layer 2a are linearly arranged along longitudinal and transverse directions, i.e. in rows and columns. Square island portions forming the ferromagnetic dispersion layer 2a have widths a, while these island portions are adjacent to each other at spacing distances a.

Figure 3:
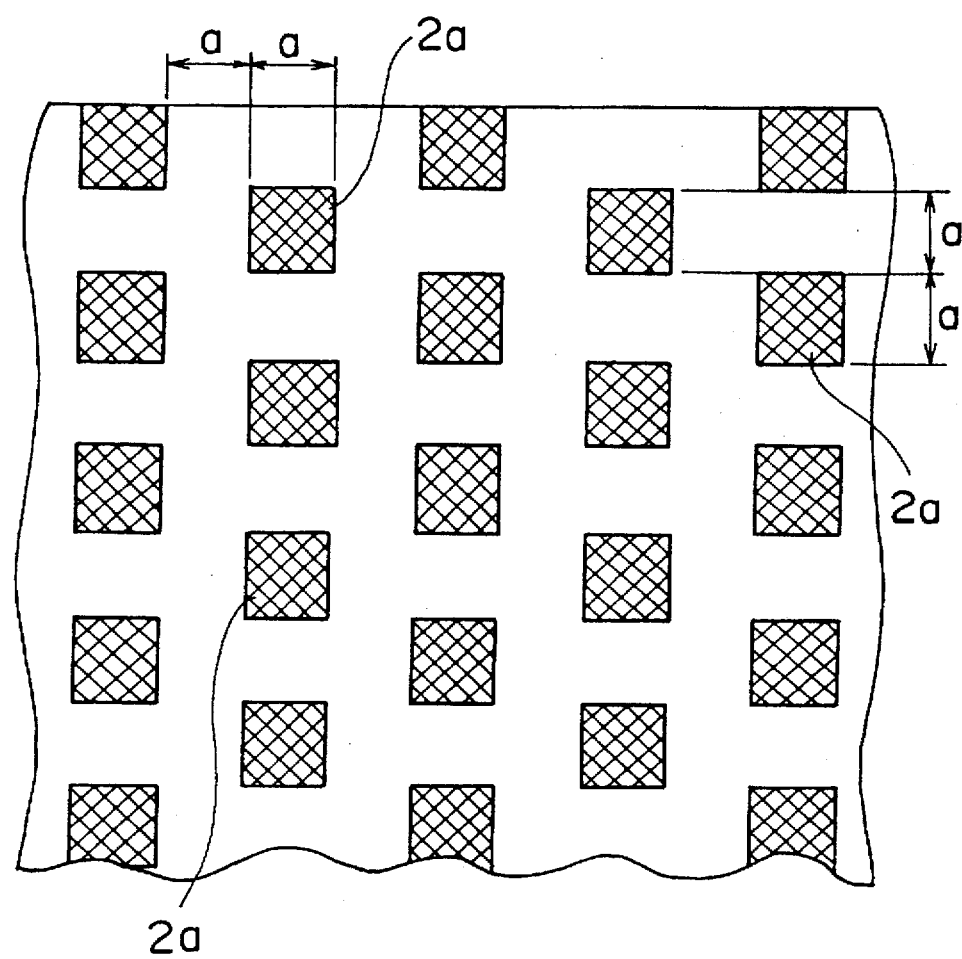
FIG. 3 is a plan view showing another arrangement of the ferromagnetic dispersion layer in the magnetoresistance effect element of the embodiment according to the first aspect of the present invention.

FIG. 3 illustrates another exemplary arrangement of the island portions of the ferromagnetic dispersion layer 2a shown in FIG. 1. In the arrangement shown in FIG. 3, the island portions of the ferromagnetic dispersion layer 2a are alternately displaced stepwise from each other in every column, i.e. the rows in adjacent columns are displaced out of alignment. Also in this state, square island portions forming the ferromagnetic dispersion layer 2a have widths a, while these island portions are adjacent to each other at spacing distances a.

Figure 4:
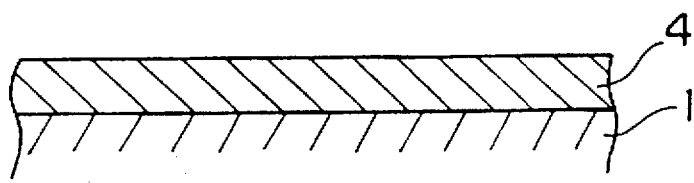
FIGS. 4(a) to 4(f) are schematic sectional views showing steps of manufacturing the magnetoresistance effect element according to the embodiment shown in FIG. 1.
Figure 4:
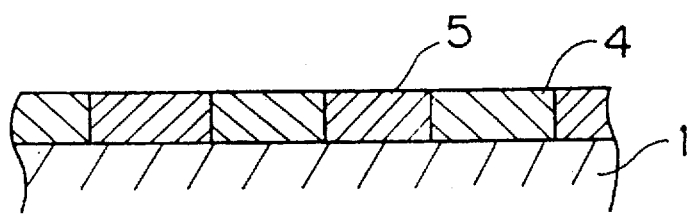
Figure 4:
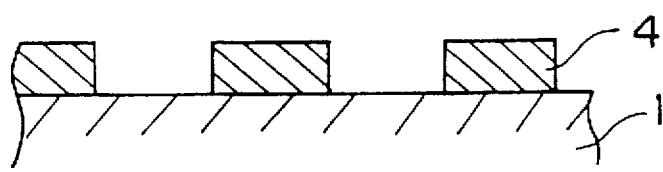
Figure 4:
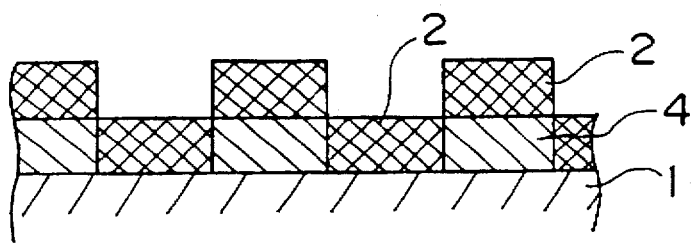
Figure 4:
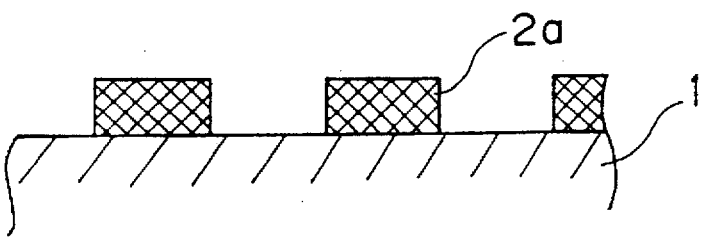
Figure 4:
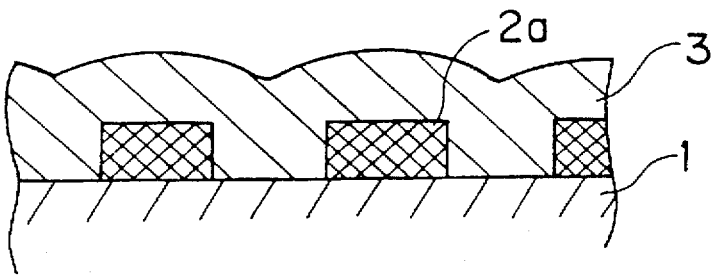

FIGS. 4(a) to 4(f) are schematic sectional views showing steps of manufacturing the embodiment shown in FIG. 1. Referring to FIG. 4(a), a resist film 4 is applied to the overall upper surface of the non-magnetic substrate 1. Referring to FIG. 4(b), portions 5 of the resist film 4 for forming the island portions of the ferromagnetic dispersion layer 2a are exposed. Referring to FIG. 4(c), the exposed portions 5 are removed from the resist film 4. Referring to FIG. 4(d), a ferromagnetic metal film 2 is formed by electron beam deposition. This ferromagnetic metal film 2 is formed on the remaining portions of the resist film 4 and on the portions of the non-magnetic substrate 1 that have been revealed between the remaining portions of the resist film 4. Referring to FIG. 4(e), portions of the ferromagnetic metal film 2 that formed on the remaining portions of the resist film 4 are removed by etching while leaving those portions of the metal film 2 formed on the non-magnetic substrate 1, thereby defining the ferromagnetic dispersion layer 2a. Referring to FIG. 4(f), the non-magnetic metal film 3 consisting of Ag is formed by electron beam deposition. This non-magnetic metal film 3 is formed on the island portions of the ferromagnetic dispersion layer 2a and on the non-magnetic substrate 1 at areas between the island portions. In other words, the non-magnetic metal film 3 is formed to cover side surfaces and upper surfaces of the island portions of the ferromagnetic dispersion layer 2a.

Thus obtained is such a structure that the ferromagnetic dispersion layer 2a consisting of Co atoms is made up of island portions dispersed in the non-magnetic metal film 3 consisting of Ag atoms.

A plurality of samples 1 and 2 were prepared in the arrangements of the ferromagnetic dispersion layer shown in FIGS. 2 and 3 while varying the widths a of the island portions and the distances a between the adjacent island portions. Then, the magnetoresistance ratios and operating field strength values Hs of these samples were measured at room temperature. In the measurement, a magnetic field was applied in the direction along a side of island portions.

Figure 5:
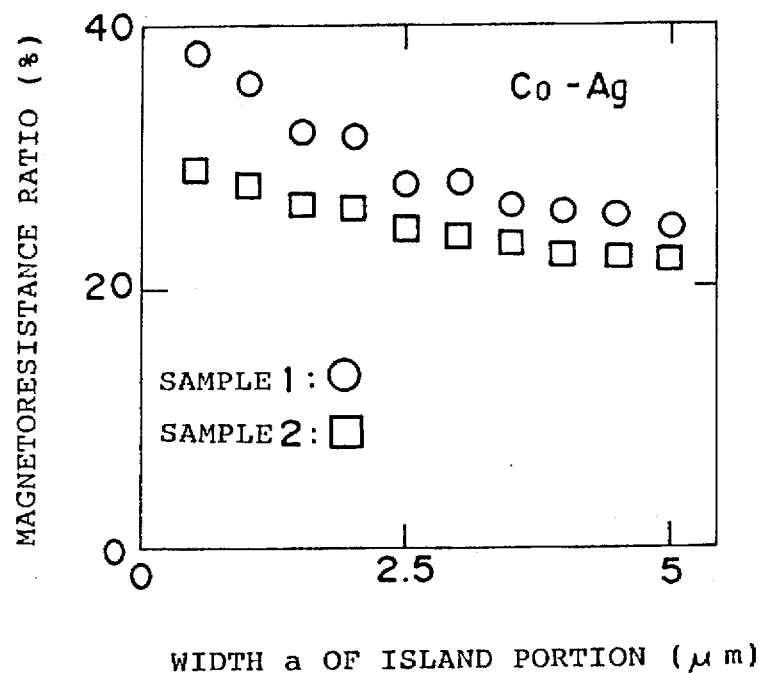
FIG. 5 illustrates relations between plane-directional widths of island portions of the ferromagnetic dispersion layer and magnetoresistance ratios in samples 1 and 2 of an example according to the first aspect of the present invention.
Figure 6:
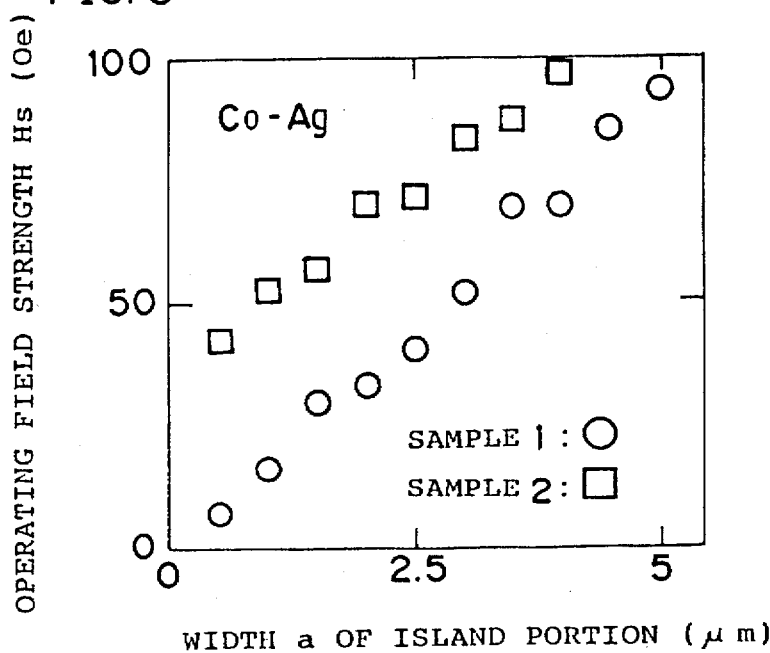
FIG. 6 illustrates relations between plane-directional widths of island portions of the ferromagnetic dispersion layer and operating field strength values in the samples 1 and 2 of the example according to the first aspect of the present invention.

FIG. 5 shows relations between the widths a of the island portions and the magnetoresistance ratios. FIG. 6 shows relations between the widths a of the island portions and the operating field strength values Hs.

A comparative sample was prepared by forming an alloy film, consisting of CoAg containing 20 atomic percent of Co, and 80 atomic percent of Ag, having a thickness of 50 nm, on a nonmagnetic substrate by electron beam deposition. In this CoAg alloy film, grains of Co atoms were formed among Ag atoms due to the non-soluble relation between the Co and Ag atoms. This CoAg alloy film exhibited a magnetoresistance ratio of 19.4% and operating field strength Hs of 3000 Oe at room temperature.

As shown in FIG. 5, the inventive samples exhibited magnetoresistance ratios in a range of 20 to 40%, which were higher than that of the comparative CoAg alloy film, when the widths a of the island portions were not more than 5 µm. As shown in FIG. 6, the inventive samples exhibited operating field strengths Hs of 5 to 100 Oe, which were considerably smaller than that of the comparative sample, and which exhibited a remarkable improvement in field sensitivity.

The magnetoresistance ratios were increased and the operating field strength values Hs were reduced as the widths a of the island portions were reduced. Thus, it is understood that the characteristics of the magnetoresistance field effect element according to the present invention are improved as the width of the island portions is reduced.

Comparing the samples 1 and 2 with each other, the sample 1 having island portions which were linearly arranged in longitudinal and transverse directions with regularity exhibited higher magnetoresistance ratios and smaller operating field strength values Hs as compared with the sample 2. Such differences between the characteristics of the samples 1 and 2 were rendered remarkable as the widths a of the island portions were reduced.

Then, samples 3 and 4 of the magnetoresistance effect element shown in FIG. 1 were prepared by employing NiFe alloys and Ag metals for forming ferromagnetic dispersion layers and non-magnetic metal films respectively. The samples 3 and 4 were provided with ferromagnetic dispersion layers having the arrangements shown in FIGS. 2 and 3 respectively. The NiFe alloys and Ag atoms were in a nonsoluble relation whereby they are not atomically mixed with each other in solid and liquid phases.

Also as to the samples 3 and 4, the widths a of the island portions and the distances a between adjacent island portions were varied in the ferromagnetic dispersion layer. Then, the magnetoresistance ratios and operating field strength values Hs were measured similarly to the samples 1 and 2.

Figure 7:
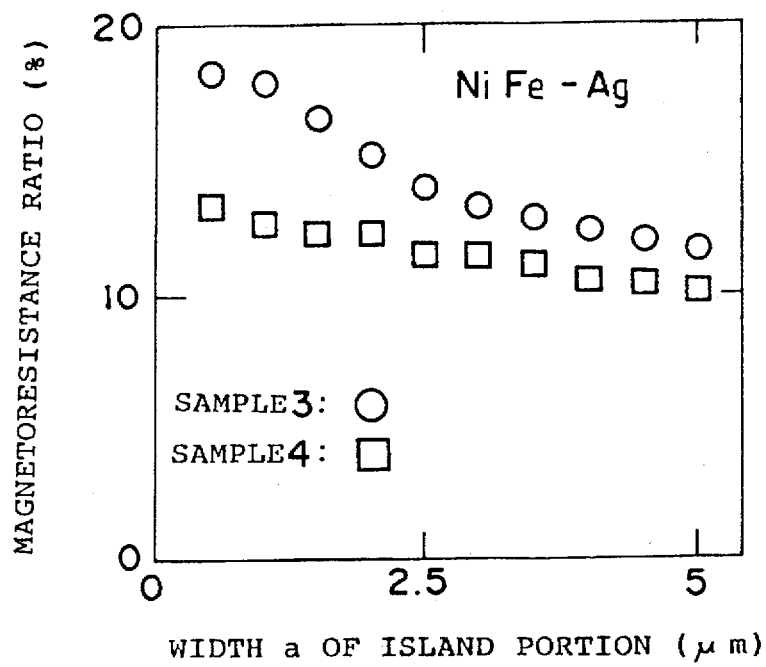
FIG. 7 illustrates relations between plane-directional widths of island portions of the ferromagnetic dispersion layer and magnetoresistance ratios in samples 3 and 4 of the example according to the first aspect of the present invention.
Figure 8:
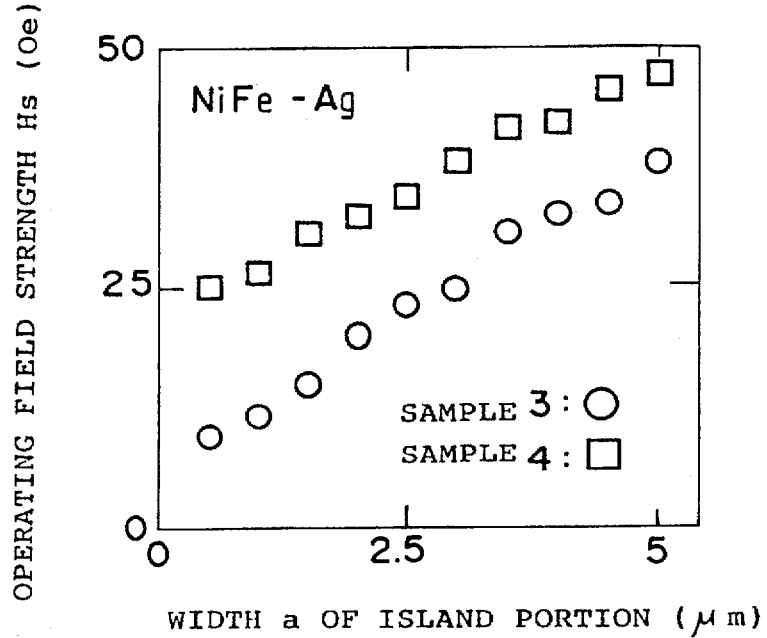
FIG. 8 illustrates relations between plane-directional widths of island portions of the ferromagnetic dispersion layer and operating field strength values in the samples 3 and 4 of the example according to the first aspect of the present invention.

FIG. 7 shows relations between the widths a of the island portions and the magnetoresistance ratios. FIG. 8 shows relations between the widths a of the island portions and the operating field strength values Hs. A comparative sample was prepared by forming an alloy film, which was composed of $(Ni_{80}Fe_{20})_{20}Ag_{80}$, having a thickness of 50 nm on a non-magnetic substrate by electron beam deposition. In this alloy film, grains of atoms of an NiFe alloy were formed among Ag atoms due to the non-soluble relation between the NiFe alloy and the Ag atoms, similarly to the aforementioned CoAg alloy film. This (NiFe)Ag alloy film exhibited a magnetoresistance ratio of 6.5% and an operating field strength Hs of 2300 Oe.

As shown in FIG. 7, the inventive samples 3 and 4 exhibited magnetoresistance ratios in a range of 10 to 20% which were higher than the 6.5% value of the comparative sample.

As shown in FIG. 8, further, the operating field strengths Hs of the samples 3 and 4 were in a range of 10 to 50 Oe, which is reduced to about $1/100$ as compared with the operating field strength Hs of 2300 Oe of the comparative sample, with a remarkable improvement in field sensitivity.

The magnetoresistance ratios were increased and the operating field strength values Hs were reduced as the widths a of the island portions of the ferromagnetic dispersion layer were reduced. Thus, it is understood that the characteristics of the magnetoresistance effect element according to the present invention are improved as the width of the island portions is reduced.

Comparing the samples 3 and 4 with each other, the sample 3 having island portions which were linearly arranged in longitudinal and transverse directions with regularity exhibited higher magnetoresistance ratios and smaller operating field strength values Hs as compared with the sample 4, similarly to the comparison of the samples 1 and 2. Such differences between the characteristics of the samples 3 and 4 were rendered remarkable as the widths a of the island portions were reduced.

Figure 9:
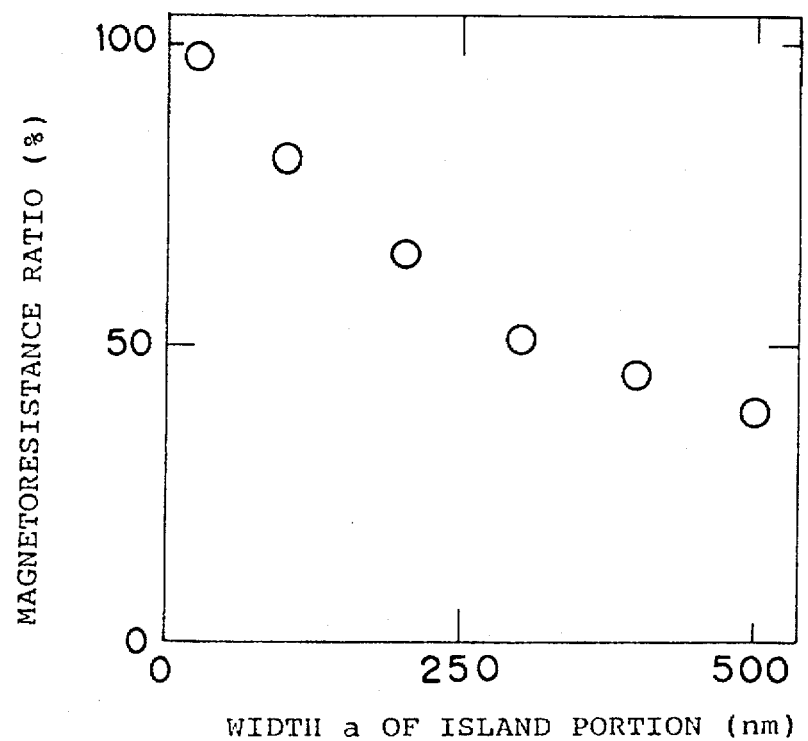
FIG. 9 illustrates a relation between the plane-directional width of the island portions of the ferromagnetic dispersion layer and the magneto-resistance ratio in the sample 1 of the example according to the first aspect of the present invention.
Figure 10:
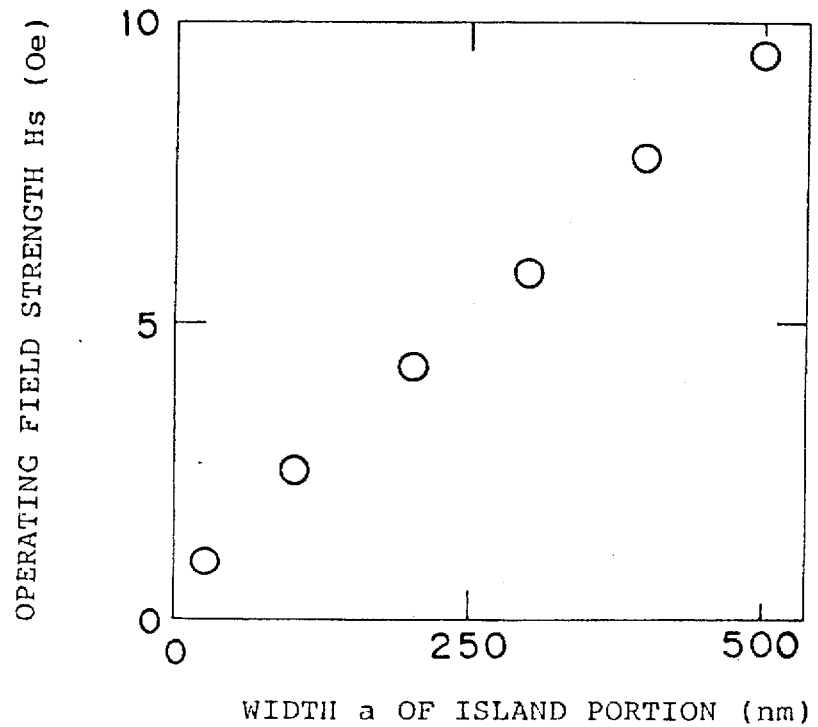
FIG. 10 illustrates a relation between the plane-directional width of island portions of the ferromagnetic dispersion layer and the operating field strength in the sample 1 of the example according to the first aspect of the present invention.

The widths a of the island portions were reduced further in the sample 1 and the magnetoresistance ratios and the operating field strength values Hs were measured, thereby investigating the influence exerted by such refinement of the widths a of the island portions. FIGS. 9 and 10 show the magnetoresistance ratios and the operating field strength values Hs respectively. When the widths a of the island portions were reduced from 500 nm to 60 nm, the magnetoresistance ratios were increased and the operating field strength values Hs were reduced, as shown in FIGS. 9 and 10. When the widths a of the island portions were 60 nm, the sample 1 exhibited an extremely high magnetoresistance ratio of 98%, and an extremely small operating field strength value Hs of 1 Oe, with excellent field sensitivity.

In order to investigate the influence exerted by the plane shapes of the ferromagnetic dispersion layers, the ratio of the transverse widths a to longitudinal widths a of the island portions of the ferromagnetic dispersion layer were changed as a/c=1, 2, and 3, to measure magnetoresistance ratios and operating field strength values Hs, under similar conditions to the sample 1. The distance between the island portions was set to a. FIG. 11 shows the magnetoresistance ratios in samples having various ratios a/c and various widths a of the island portions in a range of 500 nm and 60 nm. It is understood from FIG. 11 that the magnetoresistance ratios were increased as the ratios a/c were increased.

FIG. 12 shows operating field strength values Hs of the samples having various widths a of island portions in a range of 500 nm to 60 nm. It is also understood from FIG. 12 that the operating field strength values Hs were reduced as the ratios a/c were increased.

Accordingly, it is understood that an improvement in magnetoresistance ratio and operating field strength Hs is obtained when the ratios a/c of the dimensions of island portions are varied to produce anisotropy in configuration. In the measurement, a magnetic field was applied in the longitudinal direction of island portions, which was most effective.

Figure 13:
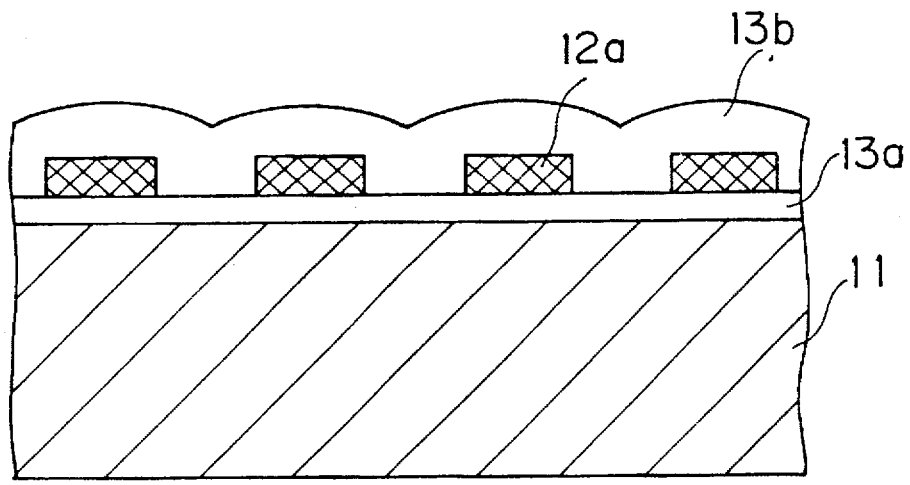
FIG. 13 is a schematic sectional view showing a second embodiment according to the first aspect of the present invention.

FIG. 13 is a schematic sectional view showing another embodiment according to the first aspect of the present invention. Referring to FIG. 13, a first non-magnetic metal film 13a, consisting of Ag atoms and having a thickness of 50 Å, is formed by electron beam deposition on a non-magnetic substrate 11 consisting of a non-magnetic substance such as glass. Then, island portions of a ferromagnetic dispersion layer 12a, consisting of Co atoms and having thicknesses of 50 Å, are formed on the first non-magnetic metal film 13a by photolithography, similarly to the embodiment shown in FIG. 1. Then, a second non-magnetic metal film 13b, consisting of Ag atoms similarly to the first non-magnetic metal film 13a, is formed by electron beam deposition on the ferromagnetic dispersion layer 12a and on the first non-magnetic metal film 13a at areas not having the islands of the dispersion layer 12a. Thus, the island portions of the ferromagnetic dispersion layer 12a are held between the first and second non-magnetic metal films 13a and 13b. Due to the structure shown in FIG. 13, it is possible to further increase the contact areas between the ferromagnetic dispersion layer 12a and the non-magnetic metal films 13a and 13b, thereby further increasing the influence on scattered states of conduction electrons in the non-magnetic metal films 13a and 13b. Thus, it is possible to further increase the magnetoresistance ratio and reduce the operating field strength.

Figure 14:
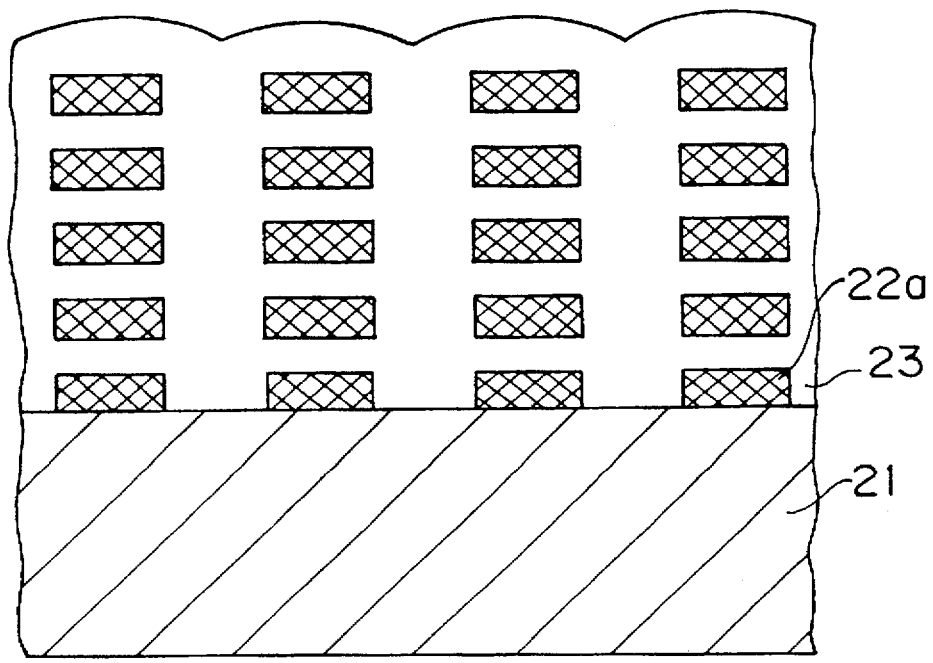
FIG. 14 is a schematic sectional view showing a third embodiment according to the first aspect of the present invention.

FIG. 14 is a schematic sectional view showing still another embodiment according to the first aspect of the present invention. Referring to FIG. 14, island portions of ferromagnetic dispersion layer 22a are formed on a non-magnetic substrate 21 and a non-magnetic metal film 23 is formed thereon, similarly to the embodiment shown in FIG. 1. According to this embodiment, a plurality of units each consisting of the ferromagnetic dispersion layer 22a and the non-magnetic metal film 23 are stacked to form a multilayer structure. Thus, it is possible to stack a plurality of units of the ferromagnetic dispersion layer and the non-magnetic metal films according to the present invention, to form a magnetoresistance effect element.

Figure 15:
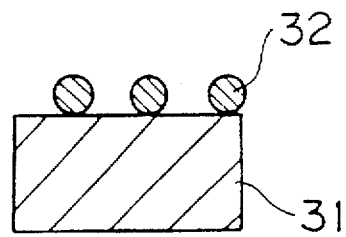
FIGS. 15(a) and 15(b) are schematic sectional views showing manufactur-steps for a fourth embodiment according to the first aspect of the present invention.
Figure 15:
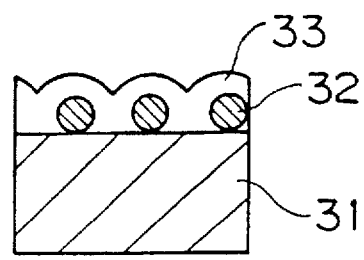

FIGS. 15(a) and 15(b) are schematic sectional views showing manufacturing steps for a further embodiment according to the first aspect of the present invention. According to this embodiment, ferromagnetic dispersion layer portions are formed as fine grain layers. Referring to FIG. 15(a), ferromagnetic fine grains of a ferromagnetic metal or alloy such as Co or an NiFe alloy are stuck onto a non-magnetic substrate 31 consisting of glass or silicon. Such ferromagnetic fine grains can be provided by gas flow sputtering or an ion cluster beam method. Portions of ferromagnetic dispersion layer 32 having thicknesses of 50 Å are independently and dispersedly formed by sticking the ferromagnetic fine grains onto the non-magnetic substrate 31 in the aforementioned manner.

Referring to FIG. 15(b), a non-magnetic metal film 33 of Ag or the like is formed on the ferromagnetic dispersion layer 32 and on the free areas of the non-magnetic substrate 31 by RF sputtering, for example.

The ferromagnetic dispersion layer according to the first aspect of the present invention can be formed by independently and dispersedly providing a layer of fine grains on a non-magnetic substrate, as shown in FIGS. 15(a) and 15(b).

Embodiments according to a second aspect of the present invention will now be described.

Figure 16:
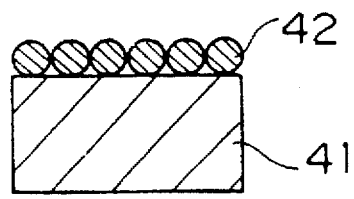
FIGS. 16(a) and 16(b) illustrate manufacturing steps for a first embodiment according to a second aspect of the present invention.
Figure 16:
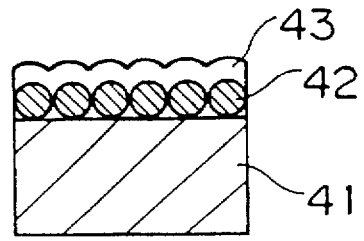

FIGS. 16(a) and 16(b) are sectional views typically showing manufacturing steps for a first embodiment according to the second aspect of the present invention. Referring to FIG. 16(a), a ferromagnetic fine grain layer 42 having a thickness of 100 Å, which is a ferromagnetic layer consisting of a ferromagnetic metal or alloy such as Co or an NiFe alloy, is formed on a nonmagnetic substrate 41 consisting of glass or silicon. The ferromagnetic fine grain layer 42 is formed as a continuous layer by gas flow sputtering or an ion cluster beam method.

Referring to FIG. 16(b), a non-magnetic metal film 43 is formed on the ferromagnetic fine grain layer 42 by RF sputtering or the like.

Examples prepared through the steps shown in FIGS. 16(a) and 16(b) will now be described.

EXAMPLE 1-1

A ferromagnetic alloy film of $Ni80Fe_{20}$ was formed on a non-magnetic substrate 41 by gas flow sputtering as the ferromagnetic fine grain layer 42, to have a thickness of 80 Å. This film was formed under an Ar pressure of 20 mTorr with power supply of 300 W, to be deposited by RF sputtering on the non-magnetic substrate 41 which was held at $3 \times 10^{-4}$ Torr.

Then, an Ag film was formed on the ferromagnetic fine grain layer 42 as formed by RF sputtering to define the non-magnetic metal film 43 to a thickness of 80 Å. This film was formed under an Ar pressure of 20 mTorr with power supply of 300 W.

A laminate film thus formed by the ferromagnetic fine grain layer 42 and the non-magnetic metal film 43 had an overall composition of $(Ni_{80}Fe_{20})_{20}Ag_{80}$.

EXAMPLE 1-2

A Co metal film was formed by gas flow sputtering to have a thickness of 80 Å, as the ferromagnetic fine grain layer 42. This film was formed under an Ar pressure of 20 mTorr with power supply of 300 W, to be deposited by RF sputtering on a non-magnetic substrate 41 which was held at $3 \times 10^{-4}$.

An Ag film was formed as the non-magnetic metal film 43, similarly to Example 1-1.

A laminate film obtained in the aforementioned manner had an overall composition of $Co_{20}Ag_{80}$.

COMPARATIVE EXAMPLE 1-1

Only a ferromagnetic alloy film of $Ni_{80}Fe_{20}$ was formed on a nonmagnetic substrate 41 similarly to Example 1-1.

COMPARATIVE EXAMPLE 1-2

For the purpose of comparison with Example 1-1, an alloy film having a composition of $(Ni_{80}Fe_{20})_{20}Ag_{80}$ was formed on a non-magnetic substrate to have a thickness of 1000 Å by RF sputtering, under an Ar pressure of 20 mTorr with power supply of 300 W.

COMPARATIVE EXAMPLE 1-3

For the purpose of comparison with Example 1-2, an alloy film having a composition of $Co_{80}Ag_{20}$ was formed on a non-magnetic substrate 41 to have a thickness of 1000 Å by RF sputtering, under an Ar pressure of 20 mTorr with power supply of 300 W.

Figure 17:
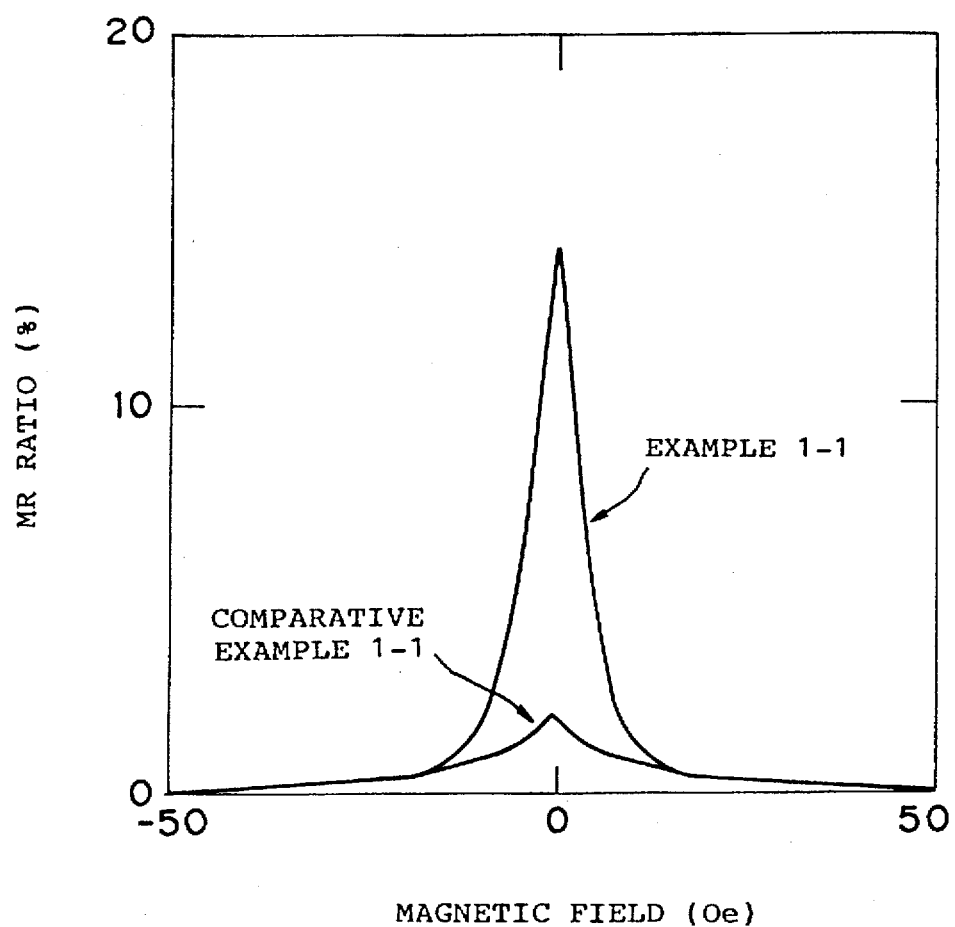
FIG. 17 illustrates magnetoresistance ratio curves in an example according to the second aspect of the present invention.
Figure 18:
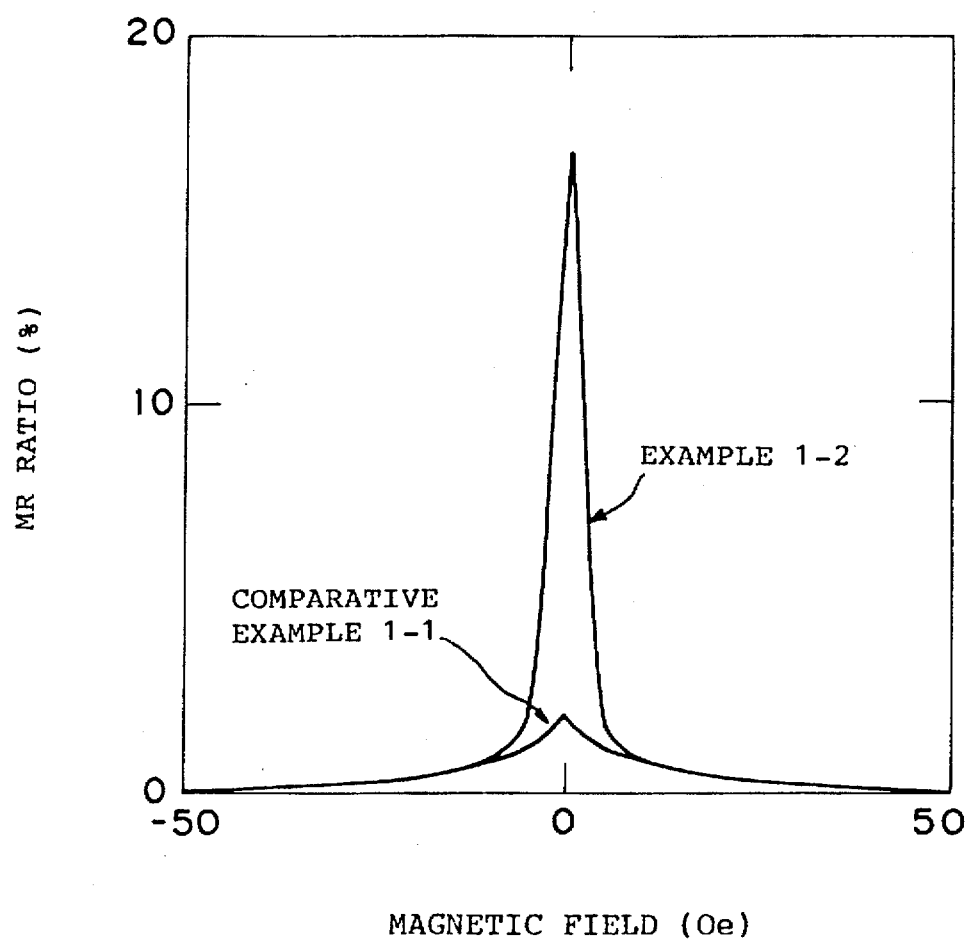
FIG. 18 illustrates magnetoresistance ratio curves in another example according to the second aspect of the present invention.

As to the magnetoresistance effect elements of Examples 1-1 and 1-2 and comparative examples 1-1 to 1-3; obtained in the aforementioned manner, magnetoresistance ratios (MR ratios) and operating field strength values at room temperature were measured. Table 1 shows the results. FIGS. 17 and 18 show magnetoresistance ratio curves of Example 1-1 and comparative example 1—1 and those of Example 1-2 and comparative example 1-1 respectively.

TABLE 1

|  | MR Ratio (%) | Operating Field Strength (Oe) |
| --- | --- | --- |
| Example 1-1 | 14.4 | 7.5 |
| Example 1-2 | 17.0 | 4.8 |
| Comparative Example 1-1 | 2.0 | 45 |
| Comparative Example 1-2 | 6.5 | 2300 |
| Comparative Example 1-3 | 19.4 | 3000 |

As shown in Table 1 and FIG. 17, the magnetoresistance effect element according to Example 1-1 has an MR ratio which is higher than that of comparative example 1-1. It is understood from Table 1 that the inventive magnetoresistance effect element has a small operating field strength value with a small saturation magnetic field.

It is also understood from Table 1 and FIG. 18 that the magnetoresistance effect element according to Example 1-2 also has a high MR ratio and a small operating field strength value with a small saturation magnetic field.

Figure 19A:
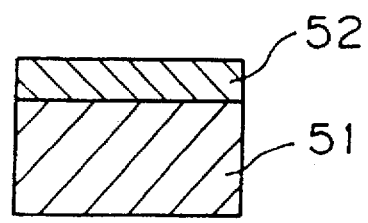
FIGS. 19(a) to 19(c) illustrate manufacturing steps for a second embodiment according to a second aspect of the present invention.
Figure 19B:
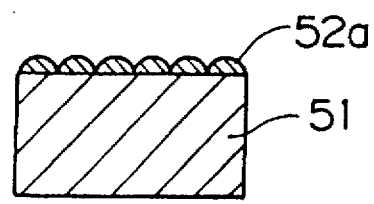
Figure 19C:
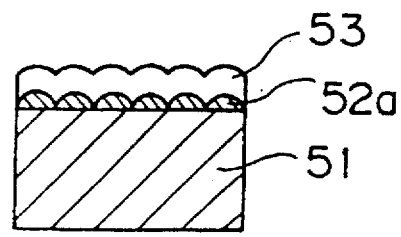

FIGS. 19(a) to 19(c) are sectional views typically showing manufacturing steps for a second embodiment according to the second aspect of the present invention.

Referring to FIG. 19(a), a ferromagnetic layer 52 consisting of a ferromagnetic metal or alloy is formed on a non-magnetic substrate 51 consisting of silicon or glass. Referring to FIG. 19(b), this ferromagnetic layer 52 is then reverse-sputtered so that its surface is textured, thereby forming a ferromagnetic layer 52a having a roughened surface. Referring to FIG. 19(c), a non-magnetic metal film 53 is formed on the ferromagnetic layer 52a having a roughened surface by sputtering or vacuum deposition, whereby the roughened texture is carried through to the surface of the film 53.

Examples manufactured through the steps shown in FIGS. 19(a) to 19(c), will now described.

EXAMPLE 2-1

An $Ni_{80}Fe_{20}$ alloy film was formed on a non-magnetic substrate 51 by RF sputtering to have a thickness of 80 Å, thereby forming a ferromagnetic layer 52 under an Ar pressure of 20 mTorr with power supply of 300 W.

Then, the surface of the ferromagnetic layer 52 as formed was roughened by reverse sputtering under an Ar pressure of 20 mTorr with power supply of 100 W for 1 minute, thereby forming a ferromagnetic layer 52a having a roughened surface.

Then, an Ag film was formed on the ferromagnetic layer 52a having a roughened surface to have a thickness of 80 Å, thereby forming a non-magnetic metal film 53 under an Ar pressure of 20 mTorr with power supply of 300 W.

The laminate film as formed had an overall composition of $(Ni_{80}Fe_{20})_{30}Ag_{70}$.

EXAMPLE 2-2

A Co metal film was formed by RF sputtering to have a thickness of 80 Å as the ferromagnetic layer 52, under an Ar pressure of 20 mTorr with power supply of 300 W.

Then, the surface of the ferromagnetic layer 52 as formed was roughened by reverse sputtering under an Ar pressure of 20 mTorr with power supply of 100 W for 1 minute, thereby forming a ferromagnetic layer 52a having a roughened surface.

Then, an Ag metal film was formed on the ferromagnetic layer 52a having a roughened surface by RF sputtering under an Ar pressure of 20 mTorr with power supply of 300 W.

The laminate film as obtained had an overall composition of $Co_{30}Ag_{70}$.

COMPARATIVE EXAMPLE 2-1

For the purpose of comparison with Example 2-1, an alloy film of $(Ni_{80}Fe_{20})_{30}Ag_{70}$ was formed on a non-magnetic substrate to have a thickness of 1000 Å by RF sputtering.

COMPARATIVE EXAMPLE 2-2

For the purpose of comparison with Example 2-2, an alloy film of $Co_{30}Ag_{70}$ was formed on a non-magnetic substrate to have a thickness of 1000 Å by RF sputtering.

As to the magnetoresistance effect elements of Examples 2-1 and 2-2 and comparative examples 2-1 and 2-2 obtained in the aforementioned manner, magnetoresistance ratios (MR ratios) and operating field strength values were measured.

Table 2 shows the results.

Figure 20:
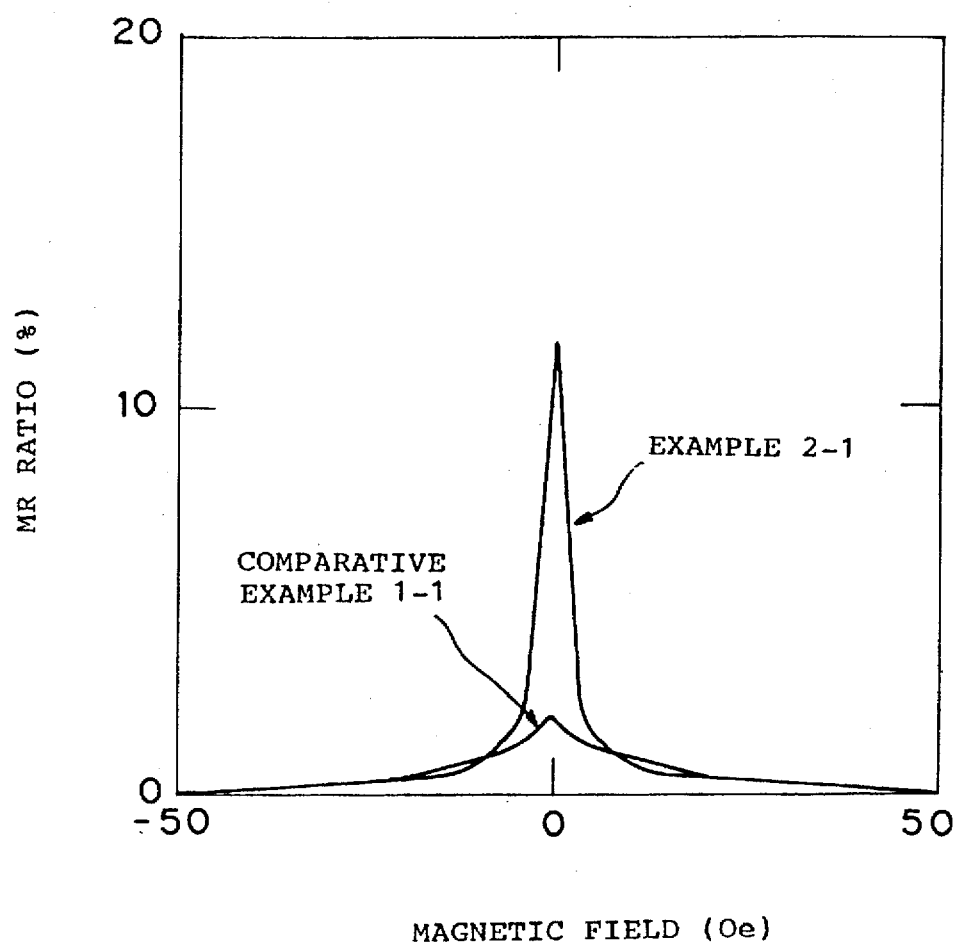
FIG. 20 illustrates magnetoresistance ratio curves in another example according to the second aspect of the present invention.
Figure 21:
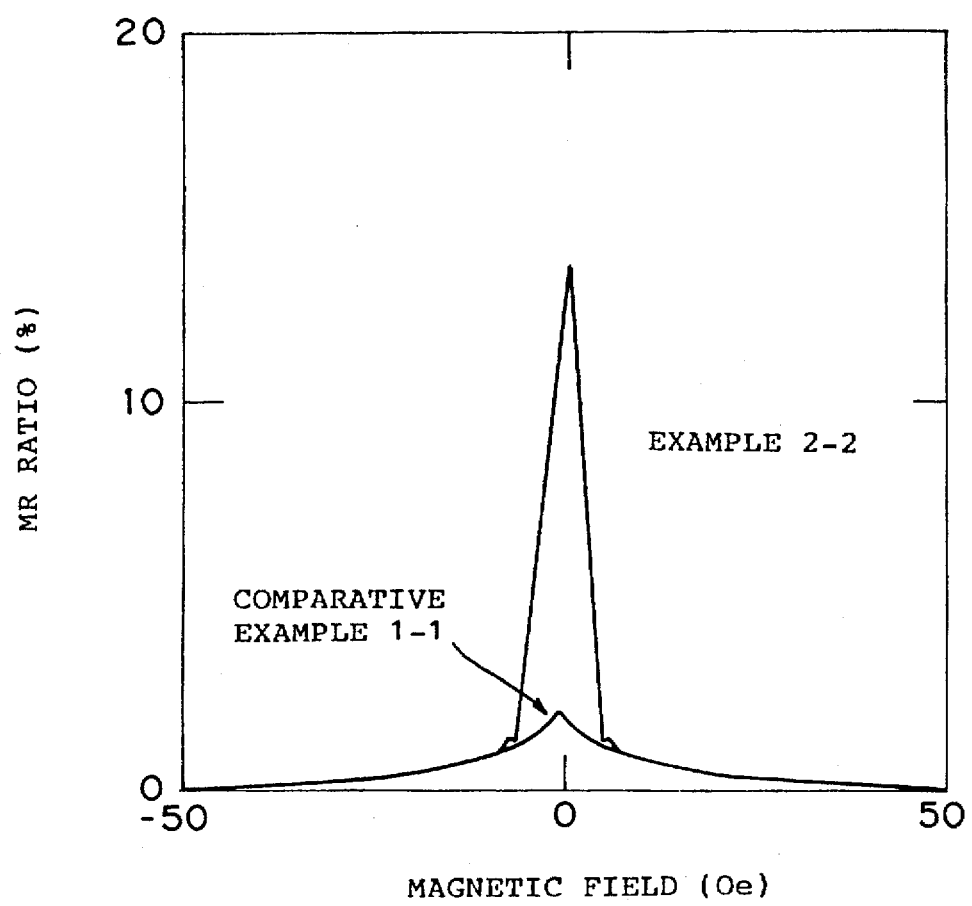
FIG. 21 illustrates magnetoresistance ratio curves in still another example according to the second aspect of the present invention.

FIGS. 20 and 21 show magnetoresistance ratio curves of Example 2-1 and Example 2-2 respectively.

TABLE 2

|  | MR Ratio (%) | Operating Field Strength (Oe) |
| --- | --- | --- |
| Example 2-1 | 11.8 | 3.8 |
| Example 2-2 | 13.8 | 5.2 |
| Comparative Example 2-1 | 5.2 | 2100 |
| Comparative Example 2-2 | 17.6 | 2800 |

As clearly understood from Table 2 and FIG. 20, the magnetoresistance effect element according to Example 2-1 has a high MR ratio and a small operating field strength value with a small saturation magnetic field. It is further understood from Table 2 and FIG. 21 that the magnetoresistance effect element according to Example 2-2 also has a high MR ratio and a small operating field strength value with a small saturation magnetic field.

Figure 22A:
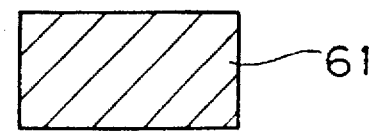
FIGS. 22(a) to 22(d) illustrate manufacturing steps for a third embodiment according to the second aspect of the present invention.
Figure 22B:
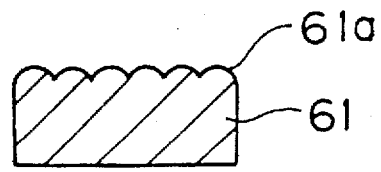
Figure 22C:
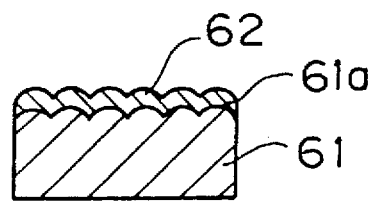

FIGS. 22(a) to 22(d) are sectional views typically showing manufacturing steps for a third embodiment according to the second aspect of the present invention. Referring to FIG. 22(a), a nonmagnetic substrate 61 consisting of silicon or glass is reverse-sputtered so that its surface is roughened as shown in FIG. 22(b), thereby forming a textured surface 61a. Referring to FIG. 22(c), a ferromagnetic layer 62 is formed on the textured surface 61a of the non-magnetic substrate 61. The surface of the ferromagnetic layer 62 is influenced and roughened by the textured surface 61a of the non-magnetic substrate 61.

Figure 22D:
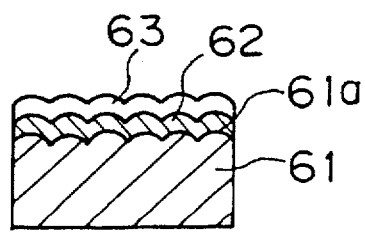

Referring to FIG. 22(d), a non-magnetic metal film 63 is formed on the ferromagnetic layer 62. As shown in FIG. 22(d), the surface of the ferromagnetic layer 62 which is formed on the nonmagnetic substrate 61 having a roughened surface is so textured that the contact area between the same and the non-magnetic metal film 63 provided thereon is increased. Therefore, it is possible to obtain a higher magnetoresistance ratio and smaller operating field strength with a small saturation magnetic field, similarly to the first and second embodiments shown in FIGS. 16(a) and 16(b) and 19(a) to 19(c).

Figure 23A:
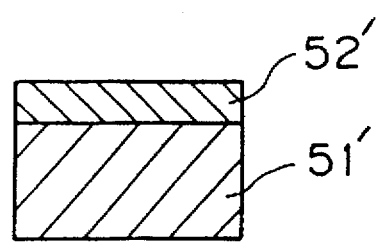
FIGS. 23(a) to 23(c) are similar to FIGS. 19(a) to 19(c), but illustrate manufacturing steps for a third aspect of the present invention.
Figure 23B:
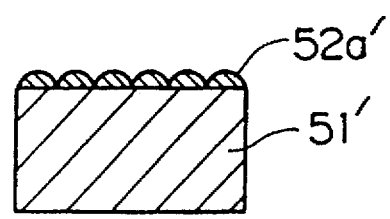
Figure 23C:
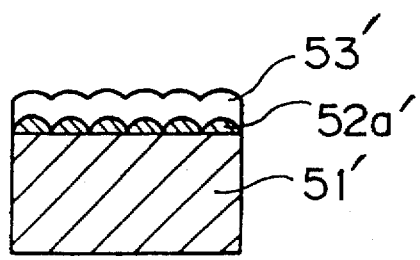
Figure 24A:
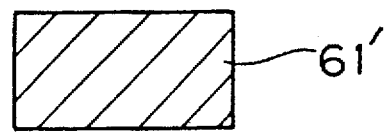
FIGS. 24(a) to 24(d) are similar to FIGS. 22(a) to 22(d), but illustrate manufacturing steps for another embodiment of the third aspect of the present invention.
Figure 24B:
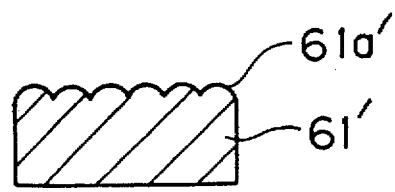
Figure 24C:
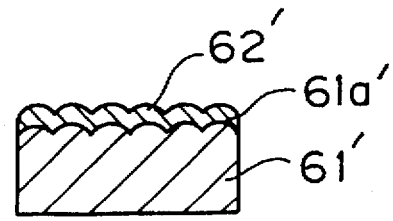
Figure 24D:
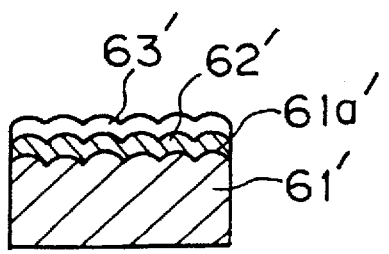

An embodiment according to the third aspect of the present invention is provided by assigning a non-magnetic metal film to the reference numeral 52a' and a ferromagnetic layer to the reference number 53' in FIG. 23, which is generally similar to FIG. 19, but relates to the third aspect of the invention. Referring to FIG. 23(a), a non-magnetic metal film 52' consisting of a non-magnetic metal or alloy is formed on a non-magnetic substrate 51' consisting of silicon or glass. Referring to FIG. 23(b), this nonmagnetic metal film 52' is then reverse-sputtered so that its surface is textured, thereby forming a non-magnetic metal film 52a' having a roughened surface. Referring to FIG. 23(c), a ferromagnetic layer 53' is formed on the non-magnetic metal film 52a' having a roughened surface by sputtering or vacuum deposition.

Another embodiment according to the third aspect of the present invention is provided by assigning a non-magnetic metal film to the reference numeral 62' and a ferromagnetic layer to the reference numeral 63' in FIG. 24. Referring to FIG. 24(a), a nonmagnetic substrate 61' consisting of silicon or glass is reverse-sputtered so that its surface is roughened as shown in FIG. 24(b), thereby forming a textured surface 61a'. Referring to FIG. 24(c), a non-magnetic metal film 62' is formed on the textured surface 61a' of the non-magnetic substrate 61'. The surface of the non-magnetic metal film 62' is influenced and roughened by the textured surface 61a' of the non-magnetic substrate 61'. Referring to FIG. 24(d), a ferromagnetic layer 63' is formed on the non-magnetic metal film 62'. As shown in FIG. 24(d), the surface of the non-magnetic metal film 62' which is formed on the non-magnetic substrate 61' having a roughened surface is so textured that the contact area between the same and the ferromagnetic layer 63' provided thereon is increased.

Although the present invention has been described and illustrated in detail, it is clearly understood that the same is by way of illustration and example only and is not to be taken by way of limitation, the spirit and scope of the present invention being limited only by the terms of the appended claims.

What we claim is:

1. A magnetoresistance effect element comprising:
   a non-magnetic substrate;
   a ferromagnetic layer comprising a ferromagnetic metal or alloy arranged on said substrate, and having a textured surface; and
   a non-magnetic metal film, which comprises at least one atomic element that is non-soluble with said ferromagnetic metal or alloy, and which is arranged as a continuous film layer on said textured surface of said ferromagnetic layer;
   wherein said textured surface has such a surface texture as to increase a contact area of an interface between said ferromagnetic layer and said non-magnetic metal film, for reducing an operating field strength and increasing a magnetoresistance ratio of said magnetoresistance effect element.

2. The magnetoresistance effect element in accordance with claim 1, wherein said ferromagnetic layer is a continuous layer of ferromagnetic fine grains that are continuously arranged on said substrate.

3. The magnetoresistance effect element in accordance with claim 1, wherein said ferromagnetic layer is prepared by forming a thin film of said ferromagnetic metal or alloy on said substrate and then roughening a surface of said thin film by reverse sputtering to form said textured surface, and wherein said surface texture of said textured surface is such a type of surface texture as results from reverse sputtering.

4. The magnetoresistance effect element in accordance with claim 1, wherein said substrate has a textured substrate surface and said ferromagnetic layer is formed on said textured substrate surface.

5. The magnetoresistance effect element in accordance with claim 4, wherein said textured substrate surface has such a type of surface texture as results from reverse sputtering said substrate.

6. The magnetoresistance effect element in accordance with claim 1, wherein said ferromagnetic layer substantially consists of Co or NiFe, and said non-magnetic metal film substantially consists of Ag.

7. The magnetoresistance effect element in accordance with claim 1, further comprising another ferromagnetic layer and another nonmagnetic metal film that are stacked sequentially on said non-magnetic metal film.

8. The magnetoresistance effect element in accordance with claim 1, wherein said textured surface has such a character that it varies scattered states of conduction electrons in said non-magnetic film dependent upon a magnetization state of said ferromagnetic layer.

9. The magnetoresistance effect element in accordance with claim 1, wherein said ferromagnetic layer is at least about 80 Å thick.

10. A magnetoresistance effect element comprising:
    a non-magnetic substrate;
    a non-magnetic metal film arranged as a continuous film layer on said substrate and having a textured surface; and
    a ferromagnetic layer comprising a ferromagnetic metal or alloy arranged on said textured surface of said non-magnetic metal film;
    wherein said non-magnetic metal film comprises at least one atomic element that is non-soluble with said ferromagnetic metal or alloy; and
    wherein said textured surface has such a surface texture as to increase a contact area of an interface between said ferromagnetic layer and said non-magnetic metal film, for reducing an operating field strength and increasing a magnetoresistance ratio of said magnetoresistance effect element.

11. The magnetoresistance effect element in accordance with claim 10, wherein said non-magnetic metal film is prepared by forming a thin film of a non-magnetic metal or alloy including said at least one atomic element on said substrate and then roughening the surface of said thin film by reverse sputtering to form said textured surface, and wherein said surface texture of said textured surface is such a type of surface texture as results from reverse sputtering.

12. The magnetoresistance effect element in accordance with claim 10, wherein said substrate has a textured substrate surface, and said non-magnetic metal film is formed on said textured substrate surface.

13. The magnetoresistance effect element in accordance with claim 12, wherein said textured substrate surface has such a type of surface texture as results from reverse sputtering said substrate.

14. The magnetoresistance effect element in accordance with claim 10, wherein said ferromagnetic layer substantially consists of Co or NiFe, and said non-magnetic metal film substantially consists of Ag.

15. The magnetoresistance effect element in accordance with claim 10, further comprising another non-magnetic metal film and another ferromagnetic layer that are stacked sequentially on said ferromagnetic layer.

16. The magnetoresistance effect element in accordance with claim 10, wherein said textured surface has such a character that it varies scattered states of conduction electrons in said non-magnetic film dependent upon a magnetization state of said ferromagnetic layer.

17. The magnetoresistance effect element in accordance with claim 10, wherein said ferromagnetic layer is at least about 80 Å thick.

* * * * *

UNITED STATES PATENT AND TRADEMARK OFFICE
CERTIFICATE OF CORRECTION

PATENT NO. : 5,738,929
DATED : Apr. 14, 1998
INVENTOR(S) : Maeda et al.

It is certified that error appears in the above-indentified patent and that said Letters Patent is hereby corrected as shown below:

Col. 8, line 53, replace "a" (second occurrence) by --c--.

Col. 10, line 23, after "of" replace "Ni80Fe$_{20}$" by --Ni$_{80}$Fe$_{20}$--.

Signed and Sealed this

Twenty-fifth Day of August, 1998

*Attest:*

BRUCE LEHMAN

*Attesting Officer*     *Commissioner of Patents and Trademarks*